United States Patent [19]
Pratt, Jr.

[11] 3,927,385
[45] Dec. 16, 1975

[54] LIGHT EMITTING DIODE

[75] Inventor: George W. Pratt, Jr., Wayland, Mass.

[73] Assignee: Massachusetts Institute of Technology, Cambridge, Mass.

[22] Filed: June 3, 1974

[21] Appl. No.: 475,697

Related U.S. Application Data

[63] Continuation-in-part of Ser. No. 277,710, Aug. 3, 1972, abandoned, which is a continuation-in-part of Ser. No. 5,088, Jan. 22, 1970, abandoned.

[52] U.S. Cl. ............ 331/94.5 H; 313/499; 357/16; 357/17; 357/18; 357/19; 357/60; 357/64
[51] Int. Cl.² ........................ H015 3/19; G02F 1/17
[58] Field of Search ............ 357/16, 17, 18, 19, 64; 331/94.5 H; 313/499

[56] References Cited

UNITED STATES PATENTS

| | | | |
|---|---|---|---|
| 3,305,685 | 2/1967 | Wang | 313/499 |
| 3,309,553 | 3/1967 | Kroemer | 313/499 |
| 3,366,819 | 1/1968 | Crowder | 313/499 |
| 3,412,344 | 11/1968 | Pankove | 331/94.5 H |
| 3,413,506 | 11/1968 | Cuthbert et al. | 313/499 |
| 3,458,832 | 7/1969 | McGroddy et al. | 357/3 |
| 3,467,896 | 9/1969 | Kroemer | 357/16 |
| 3,496,429 | 2/1970 | Robinson | 357/18 |
| 3,516,016 | 6/1970 | Migitaka | 357/3 |
| 3,577,286 | 5/1971 | Berkenblit et al. | 148/175 |
| 3,614,549 | 10/1971 | Lorenz et al. | 357/17 |

OTHER PUBLICATIONS

Marinace, IBM Tech. Discl. Bull., Vol. 11, No. 4, Sept. 1968, p. 398.

Pankove, RCA Technical Note, No. 770, Sept. 25, 1968, "Heterojunction Laser".

Ivey, IEEE J. Quantum Electronics, Vol. QE 2, No. 11, Nov. 1966, pp. 713–716.

Wang et al., and Kroemer, Proc. IEEE, Apr. 1964, pp. 426–427.

*Primary Examiner*—William D. Larkins
*Attorney, Agent, or Firm*—Arthur A. Smith, Jr.; Robert Shaw; Martin M. Santa

[57] ABSTRACT

A light emitting p-n heterojunction crystalline diode is disclosed which is adapted to emit useful radiation in the infrared, visible or ultraviolet range of the spectrum. The diode is formed by growing or alloying one of the diode materials upon a particularly selected plane of the other diode material thereby to form the junction. The plane of the heterojunction and the specific chemical composition of the materials making up the n and p sides of the junction are selected so that the conserved components of momentum of the minority carriers injected across the heterojunction require that those minority carriers be injected into states that permit the carriers to participate in direct optical transitions.

11 Claims, 16 Drawing Figures

LIGHT EMITTING DIODE

This is a continuation-in-part of application Ser. No. 277,710 filed Aug. 3, 1972 (now abandoned) which, in turn, is a continuation-in-part of application Ser. No. 5,088 filed Jan. 22, 1970 (now abandoned); the complete record of both prior applications is hereby incorporated herein by reference.

The present invention relates to p-n heterojunction semiconductor devices and, particularly, to devices adapted to emit electromagnetic radiation in the infrared, the visible or the ultraviolet region of the spectrum.

Because of the attractiveness in terms of radiation output per watt of driving power possible in certain light emitting diodes, a great deal of effort has been expended in the development of such diodes. For example diodes have been made of $GaAs_xP_{1-x}$ alloys. These diodes work by forward biasing the p-n junction and injecting electrons from the n region into the p region and holes from the p to the n region. These injected minority carriers recombine radiatively emitting light whose frequency depends on the alloy composition. Pure GaAs produces radiation at about 8500A which is not visible. By alloying with GaP, which has a larger energy gap than GaAs, that is, 2.24 ev vs. 1.38 ev, visible radiation in the red can be obtained. However, pure GaP will not lead to an efficient light emitting diode because it is an indirect gap material, i.e., the minimum of the conduction band and maximum of the valence band occur at different places in $k$ space. In fact, when the $GaAs_xP_{1-x}$ alloy reaches a certain P concentration, the material switches from direct gap (GaAs is direct gap) to indirect gap. This is the limiting P concentration and light cannot be efficiently obtained at compositions beyond this limit.

Now, it has not been possible to make both $n$ and $p$ type material for a single direct gap material where the gap lies in the visible or ultraviolet regions of the spectrum. Of particular difficulty is the achievement of p-type conductivity in large band gap, that is, $> 2$ ev materials. However, p-type GaP can be made. Unfortunately, GaP is an indirect gap material and conventional injection electroluminescence does not take place because an electron at the lowest point in the conduction band (at X or (100) $\pi/a$ for GaP) cannot recombine with a hole in GaP at the highest point in the valence band (at $k$=O or $\Gamma$ for GaP) without the emission or absorption of a phonon in order that momentum be conserved. The essence of this invention is a means for controlling minority carrier injection across a p-n junction by proper selection of the junction plane so that at least some of the injected carriers can participate in direct optical transition, i.e., are injected preferentially into states from which or to which radiative transitions can occur.

Accordingly, one object of the present invention is to render an indirect gap material as, for example, GaP capable of participating in a radiative process, and to do this by making the indirect gap material a part of a p-n heterojunction device the other part of which is composed of a direct gap or an indirect gap material having the substantially same lattice constants and a lattice structure compatible with the indirect gap material.

Another object is to provide a light emitting diode particularly adapted to emit light in either the infrared, visible or the ultraviolet region of the spectrum.

Still another object is to provide a diode that is useful for producing incoherent radiation, but one that can be used, as well, to provide a coherent laser-type output.

A further object is to provide a diode in which the radiation can be initiated, terminated, and/or modulated both in amplitude and frequency in response to an electric potential applied thereto.

These and other objects are discussed in the specification and are particularly pointed out in the appended claims.

The objects of the invention are attained by a method of achieving the emission of electromagnetic radiation from a p-n heterojunction crystalline simiconductor device, that comprises, forming the heterojunction in a plane of the crystal, said plane being particularly selected so that conserved components of momentum of minority carriers injected across the heterojunction requires that said minority carriers be injected into states from which or to which a direct optical transition can be effected. The crystalline materials of which the semiconductor consists are chosen to allow injection into states from which or to which direct optical transitions can arise to produce radiation in the infrared, visible or ultraviolet region of the spectrum.

The invention will now be discussed upon reference to the accompanying drawing in which.

Figures 1A, 1B, 2A, 2B, 3A, 3B:
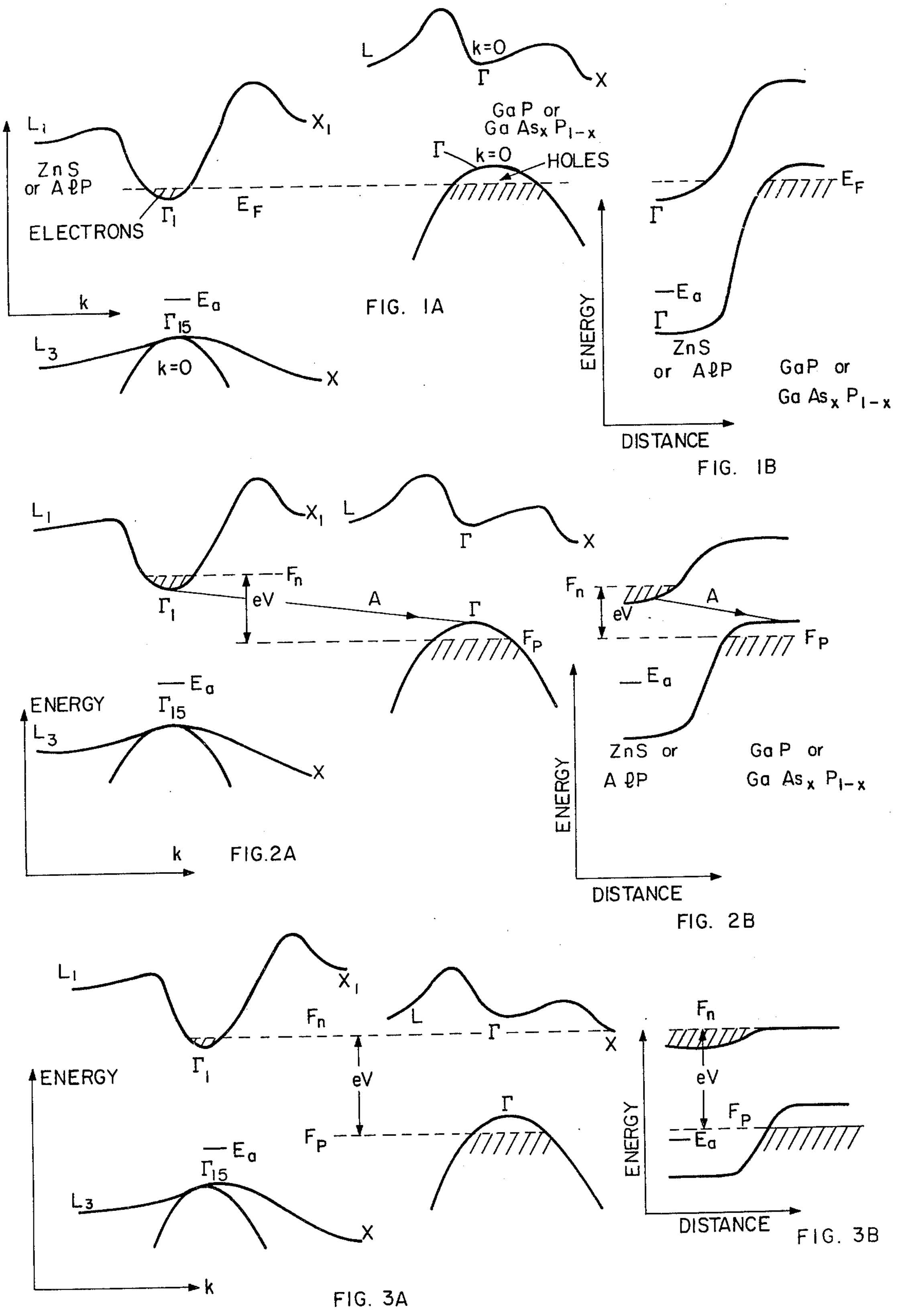
FIG. 1A is a sketch of an energy vs. momentum representation of a heterojunction between ZnS and GaP with no applied bias, the bands to the left representing n-type ZnS and the bands to the right p-type GaP.
FIG. 1B is a sketch of an energy vs. position representation of a ZnS-GaP heterojunction with no applied bias.
FIG. 2A is the same energy vs. momentum representation as shown in FIG. 1 A except that a bias is applied across the heterojunction.
FIG. 2B is the same energy vs. position representation as shown in FIG. 1B except that the bias is applied across the heterojunction.
FIGS. 3A and 3B are like FIGS. 2A and 2B except that a bias of greater magnitude is applied across the heterojunction to arrive at the representation in FIGS. 3A and 3B.

Prior to a discussion of the luminescent diode of the invention with reference to the drawing, a general discussion will be made. The basic concept herein disclosed is that of providing a crystalline semiconductor device comprising a p-n heterojunction. The heterojunction can be formed, for example, by epitaxial growth upon one of a number of preferred planes of one of the crystalline materials of which the semiconductor is fabricated. Preferred materials include p-type $GaAs_xP_{1-x}$ and an n type material chosen from the group consisting of AlP, ZnS, ZnSe, and alloys of $ZnS_ySe_{1-y}$ and $AlAs_yP_{1-y}$, where $x$ and $y$ range from 0 to 1. The heterojunction may be formed as a combination of indirect gap and direct gap materials or a combination of direct gap materials. For present purposes to simplify the explanation, the present explanation will be made with reference to a luminescent diode in which the material composing the $p$ side of the heterojunction is the indirect gap material GaP and the material composing the n side of the heterojunction is ZnS. The lattice constants of both materials are substantially the same (5.406A and 5.46A) and both may have the same lattice structures (zincblende), or the 110 plane of GaP may be joined to the 308 plane of hexagonal ZnS, these planes being compatible. The junction is grown on a preferred crystal plane, as hereinafter discussed of a limited set and is preferably the 110 or the 111 planes of the crystals involved. For example, the junction can be formed by epitaxial growth of a 110 plane of a zincblende ZnS crystal or 308 plane of the hexagonal-form of ZnS upon the 110 plane of GaP, it being kept in mind that the planes of both materials must allow a minimum strain match, i.e., be compatible.

Referring now to FIG. 1A, the band structure of zincblende ZnS is represented by the energy momentum graph on the left and that of GaP by the energy momentum graph to the right, representing in each instance the conduction and valence bands. The bands in FIG. 1A have been shown such that the Fermi level in the ZnS lies at the same energy as in the p material, which is the condition that exists in a heterojunction at thermal equilibrium. An impurity state is shown in the ZnS gap at $E_a$. If a forward bias is applied, the energy band structure of the ZnS will rise with respect to that of the GaP to some higher level, as shown in FIGS. 2A and 2B. This forward bias will tend to cause minority carrier injection, i.e., electrons to move to the $p$ side and holes to move to the $n$ side. Since there is translational periodicity in those directions perpendicular to the normal to the plane of the heterojunction, i.e., translational periodicity in plane of the heterojunction, the components $k_\perp$ of pseudo momentum $\vec{k}$ perpendicular to the component in the direction of the normal of the heterojunction plane of carriers crossing the heterojunction are conserved; the components $k_\parallel$ of pseudo momentum $\vec{k}$ parallel to the normal of the heterojunction plane are not conserved.

When the forward bias is as shown in FIGS. 2A and 2B, there can be no minority carrier injection of any consequence. This is because the electrons in the n-type material find no propagating states in the $p$ material at the same energy and, more importantly, because the unoccupied states in the $p$ material (i.e., the holes) although lying at lower energy than the electrons in the conduction band valley about Γ, do not join onto progagating or impurity, i.e., localized, solutions in the $n$ side. Because there is no overlap of electron wave functions and propagating hole wave functions, the transition probability for the process indicated by arrow shown at A in FIGS. 2A and 2B is very small. Hole injection into the impurity levels at $E_a$ is discussed hereinafter.

When the applied forward bias voltage V is such that the highest filled electron state in the $n$ material rises to the energy of the lowest state of the conduction band of the $p$ materials, as shown in FIGS. 3A, 3B, it is conditionally possible for an electron in the $n$ material to propagate across the heterojunction into the conduction band of the $p$ material. Before commenting on the conditions, it should be noted that this conditional possiblity may arise first for the injection of minority carriers from the wide gap material into the smaller gap material or first for hole injection from the narrow gap material into localized levels in the wide gap material, depending on the position of $E_a$.

It is now in order to examine the conditions under which minority carrier injection from ZnS to GaP can take place at the bias shown in FIGS. 3A and 3B. Because translational periodicity is preserved in the planes parallel to the plane of the heterojunction, as before discussed, conservation of $k$ in the corresponding plane in reciprocal space is also maintained. Suppose, now, that the heterojunction is an (001) plane, i.e., its normal lies in the (001) direction. The electrons coming from the n-side, in the case of ZnS-GaP, come from the valley about Γ. It is necessary to consider how the Bloch functions $\underset{\sim}{b}_{\Gamma}{}^{ZnS}(k_x, k_y, k_z, r)$ with $k_x$, $k_y$, $k_z$ in the neighborhood of Γ can join properly with progagating solutions, i.e., Bloch functions about the equi-energy valleys X which comprise (100), (010), (001) of the GaP conduction band. Because of the conservation of $k_\perp$, the $\underset{\sim}{b}_{\Gamma}{}^{ZnS}(k_x, k_y, k_z)$ can only join onto Bloch functions $\underset{\sim}{b}_X{}^{GaP}(o,o,k_z')$. This can be restated by saying that an electron in the conduction band at Γ in ZnS can cross the heterojunction (which here is taken to be the (001) plane) only into the conduction band valley about (001) in GaP; the other valleys are inaccessable by direct transition due to the conservation of $k_\perp$ selection rule. As a result, minority carrier injection will take place with electrons going to the (001) valley in GaP if $k_\parallel$ is not conserved, that is, the permissible change in $k_\parallel$ allows injection preferentially into the (001) valley. Once there, they can recombine with a hole at Γ in the valence band of GaP only by an indirect transition which is well known to be a very inefficient source for emission of electromagnetic waves. In this case, i.e., electron injection, except for a possible enhancement due to interface states, the heterojunction is absolutely of no value in achieving the emission of radiation and the resulting device would offer no advantage whatsoever over a GaP p-n homojunction which is known not to give off efficient band-to-band emission.

A crucial point in the present invention is the means of controlling the nature of the minority carrier injection so that the injected electrons or holes can recombine with a very much enhanced emission of radiation. Looking at FIG. 3A, this could be brought about if electrons injected from ZnS into the conduction band of GaP would preferentially be injected into the higher lying valley at Γ in GaP. Once in that valley they can make a direct optical transition to the valence band where the holes are also at Γ or to acceptor states lying above the valence band maximum at Γ. Optical transitions can occur either from band-to-band, or from band-to-interface state, or a combination thereof and impurity states or impurity bands can be introduced (ZnS, for example, can have a copper or silver impurity) into one or both sides of the heterojunction to produce states to participate in such optical transitions. Put in more general terms, this invention is a means of controlling the injection of minority carriers so that they are preferentially injected into states that have an appreciable electric dipole matrix element with unoccupied states in the band gap of the bands housing the majority carriers.

Consider now how this control of injection can be effected for the example for electrons injected from ZnS into the conduction band of GaP. Suppose the heterojunction plane is taken to be the (111) plane in the crystal, i.e., its normal in real space is in the (111) direction. Then the corresponding normal in reciprocal space is also the (111) $k$ vector. Bloch functions in the ZnS conduction band near Γ can join onto Bloch functions at the same energy in the conduction band of GaP with any $k$ value along the (111) direction but they must have the same $k_{\perp}$. Consequently, there are no solutions of Schrodinger's equation for this particular orientation of the heterojunction plane wherein a Bloch function near Γ in the ZnS conduction band joins to become a propagating solution in the GaP with a Bloch function at or near any of the conduction band minima at X, i.e., (001), (010), or (100).

Figure 4:
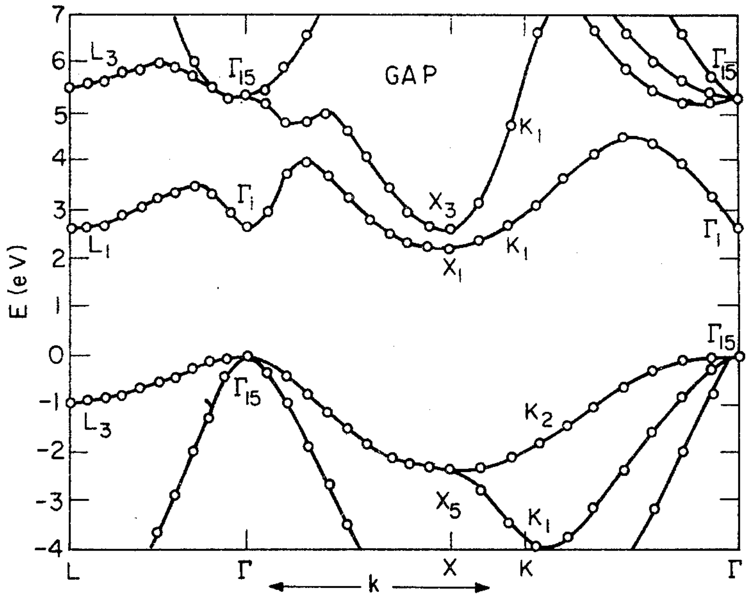
FIG. 4 is an energy-momentum representation of GaP bands as calculated by Cohen and Bergstresser in the Phys. Rev., Vol. 141, page 789, 1966.

As the ZnS band structure is raised in energy with respect to the Gap band structure beyond the point indicated in FIG. 3A, it will not be possible for electrons near Γ in ZnS to propagate into the GaP without substantial reflection until the ZnS bands are raised so that they are equienergetic with some point on the Γ → L axis, as shown in the GaP band structure of FIG. 4. This appears to occur at both Γ and L simultaneously. At this forward bias, electrons can be injected directly to Γ and L. Those directly injected to Γ can make direct radiative transitions down to the valence band where the holes are also at Γ or to acceptor states lying above the valence band maximum at $\Gamma_1$. By alloying As into GaP, the conduction band minimum at Γ can be lowered in energy relative to the minimum at L; therefore, by choosing both the (111) plane for the heterojunction and a suitable alloy composition, minority carrier injection can be confined to Γ, thereby enhancing the light emitting efficiency.

The (110) planes are cleavage planes in the III–V compounds. This then is a particularly attractive plane to use for the heterojunction in an epitaxial grown heterojunction device. For example, ZnS can be grown epitaxially on the leavage plane of the $p$ type III–V substrate. The $(110)/\sqrt{2}$ vector in reciprocal space is the normal corresponding to the (110) plane in real space. Then the tunneling selection rule will not allow propagating solutions from the vicinity of Γ in the ZnS conduction band to join to propagating solutions associated with any of the valleys at X in GaP. To see this in greater detail make a change of coordinates in k-space so that the (110) direction becomes the (0,1,0) direction in the new system, i.e.

$$(1,1,0)/\sqrt{2}=[0,1,0]$$
$$(1,\bar{1},0)/\sqrt{2}=[1,0,0]$$
$$(0,0,1)=[0,0,1]$$

Now the boundary selection rule states that the propagating states can be joined anywhere along the (0,1,0) axis, that is, [0,Y,0] where $-1 \leq Y \leq +1$. However, the (1,0,0), (0,1,0) and (0,0,1) valleys in the new system lie at $$(1,0,0) \rightarrow [1,1,0]/\sqrt{2}$$
$$(0,1,0) \rightarrow [\bar{1},1,0]/\sqrt{2}$$
$$(0,0,1) \rightarrow [0,0,1]$$

Clearly minority carriers can never reach these minima by a direct process.

Figure 5:
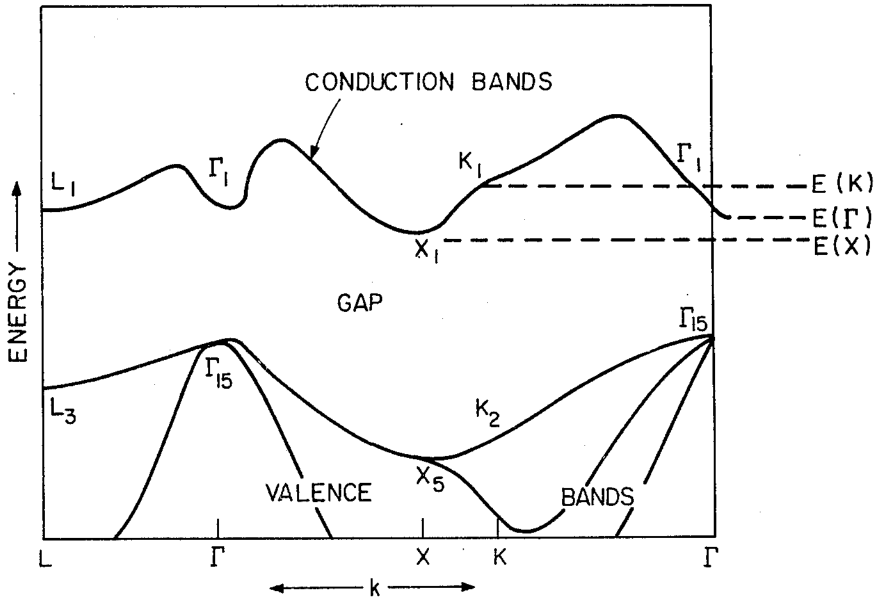
FIG. 5 is a schmatic representation of GaP bands, the lowest point along the (1,1,0) axis being at $\Gamma$ for the conduction band with minority carrier injection along the (1,1,0) axis in k-space occurring first at $\Gamma$ in the conduction band and thereby allowing direct optical transitions to the valence band or states nearby.
Figure 6:
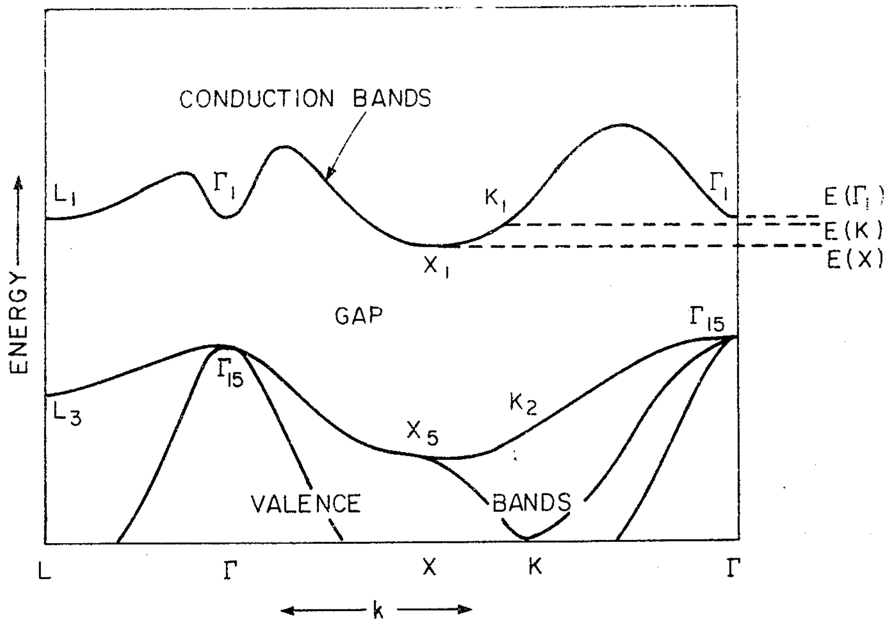
FIG. 6 is a schematic representation of GaP bands, the lowest point along the (1,1,0) axis being at K for the conduction band with minority carrier injection along the (1,1,0) axis in $k$ space occurring first at K in the conduction band thereby forbidding direct optical transitions to empty states in the valence band at $\Gamma$ or localized states nearby.

Although, as shown in the last paragraph, electrons traveling along the [0,1,0] axis in the transformed k-coordinated space can never get to the valleys at X, an additional condition must be satisfied if this is to lead to a light emitting heterojunction. This is that the point Γ must be the lowest (or nearly the lowest) point along the [0,1,0] axis. This condition is imposed because as the ZnS band structure is raised in energy relative to the GaP band structure, minority carrier injection will occur across the heterojunction as soon as the highest occupied Bloch state in the ZnS becomes equal in energy to the lowest state along the [0,1,0] axis in the conduction band of GaP. If this point is substantially displaced from Γ, then the injected minority carriers cannot participate in direct optical transitions to the empty states in or near the valence band at Γ. FIGS. 5 and 6 show sketches illustrating band structures in GaP which will and will not permit the useful emission of light from a ZnS(n)-GaP(p) forward biased heterojunction lying in the plane with normal $(1,1,0)/\sqrt{2}$. It is to be emphasized that not only must an appropriate plane be selected for the heterojunction but also it may be possible to modify the band structure of one or both sides of the junction so that minority carrier injection will occur into states capable of direct optical transitions. Means of modifying the band structure are doping, alloying and applied strain. As an example, As added to GaP will gradually lower the conduction band minimum at Γ relative to the rest of the zone until finally Γ goes below X and the alloy $GaAs_xP_{1-x}$ becomes a direct gap material. However, while still indirect gap, an alloying of As into GaP can lower Γ sufficiently so that combined with the k-conservation selection rule, minority carrier injection suitable for direct optical transitions is enhanced.

Figure 12:
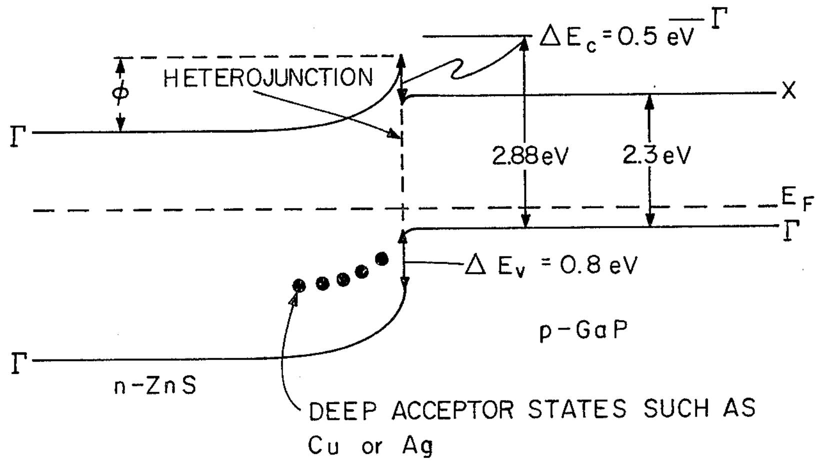
FIG. 12 is an energy vs. position representation of a ZnS-GaP heterojunction with no applied bias and shows deep-lying acceptor states in ZnS (e.g., copper or silver dopant in the ZnS).

The discussion so far has dwelt on electron injection from n-type ZnS into p-type GaP. Consideration is now given as a further example, to hole injection from the valence-band of GaP into impurity states in ZnS lying in the valence-conduction band gap at $E_a$ as shown in FIGS. 1A, 1B, 2A, 2B, 3A and 3B and also in FIG. 12. Again, the essential point is the control of minority carrier injection by proper choice of the heterojunction plane as dictated by band structure and momentum conservation considerations. It is assumed that the ZnS in the above-mentioned figures has been rendered n-type by addition of Al and that near the heterojunction the ZnS has been further doped with deep lying acceptor states such as Cu or Ag. These states are shown in FIG. 12 to be 0.8 e.v. above the valenceband of ZnS. FIG. 12 also shows the indirect gap of GaP as 2.3 e.v. and the direct gap as 2.88 e.v. The discontinuity in the valence-band energies at the heterojunction is shown as 0.8 e.v. and the conduction band discontinuity as 0.5 e.v. Clearly, if electron injection can be controlled so that it occurs into the Gap levels at Γ and not into X, the effective barrier for electron flow is increased. The deep lying states shown in FIG. 12 will be compensate, that is, accept electrons from the ZnS conduction band producing a negative charge layer near the heterojunction and hence contribute to the potential barrier for electron flow from the ZnS to the GaP. Now it is assumed that the junction is forward biased, i.e., the ZnS negative and the GaP positive. This will tend to produce electron injection into the conduction band of the GaP and hole injection from the GaP into the deep acceptor states in the ZnS. Thus, there are two types of minority carrier injection. This is, of course, always true of any p-n junction. Light emission can be achieved by hole injection into the deep impurity levels of the ZnS and subsequent fall of an electron from the conduction band of the ZnS into the empty deep impurity state, with the emission of light. For an efficient device, hole injection into the ZnS must be favored over electron injection into the GaP. Electron injection will be less effective in light production than hole injection and will mainly decrease the efficiency of the device. The required control of minority carrier injection is accomplished by choosing the (110) plane for the heterojunction since the electrons cannot be directly injected into the GaP conduction band minimum at X but will go instead to Γ in the GaP conduction band some 0.5 to 0.6 e.v. higher in energy than X. Hence, the effective barrier for electron injection is increased by proper choice of the heterojunction plane. Since Cu and Ag impurity states lie approximately 0.8 e.v. above the valence band of ZnS, they are very favorably located for hole injection from the GaP.

Clearly the above example shows that minority carrier injection of one type (electron injection in the example) can be inhibited while the opposite minority carrier type finds its injection enhanced by proper selection of the heterojunction plane. Furthermore, it is desirable to suppress that type of minority carrier injection that will not lead to the desired emission of radiation because this non-productive current across the junction will be a source of unwanted heat known not to only decrease the efficiency of the device but to degrade its lifetime. The present device can thus be distinguished from hetero-structure light emitter disclosed in Kroemer U.S. pat. No. 3,309,533, for example, which fails to recognize the efficacy of control of minority carrier injection and relies instead on massive injection of minority carriers so that they spill over into states capable of optical transitions. Such a device must operate at high injection levels and consequently will be susceptible to the penalties of inefficiency and considerable generation of heat.

Figure 7:
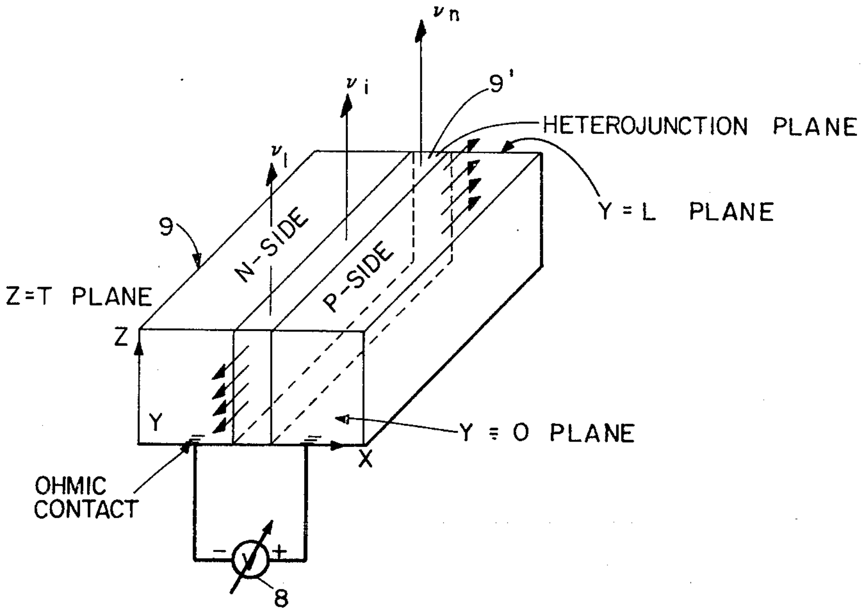
FIG. 7 is a schematic representing a graded-gap heterojunction diode.
Figure 8:
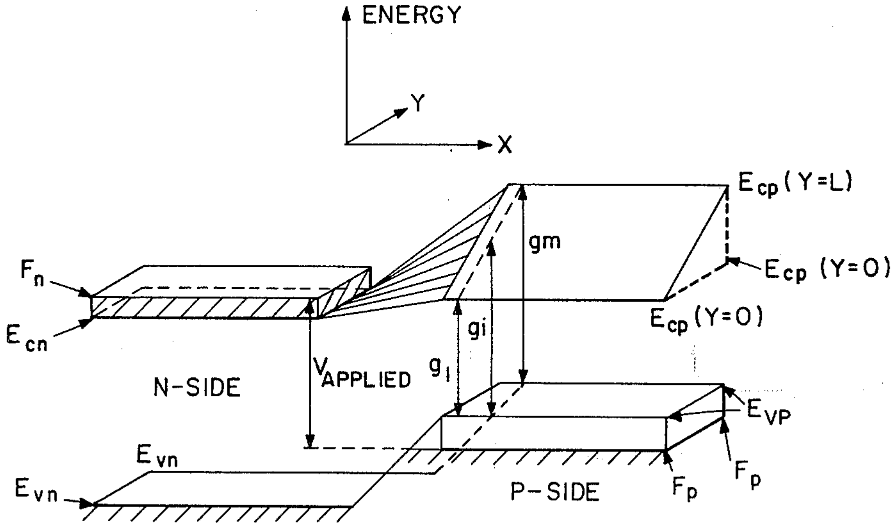
FIG. 8 is an energy vs. position representation of the graded gap heterojunction diode of FIG. 7.

It is an essential part of the discussion given above that the heterojunction plane as well as the nature of the materials forming the *n* and *p* sides of the junction both be chosen so that minority carrier injection occurs into states capable of participating in direct optical transitions. This condition may be fulfilled for a range of compositions for one or both sides of the junction. In this case a graded gap junction device can be formed as shown at 9 in FIG. 7. In FIG. 7 the heterojunction numbered 9' is shown disposed in the *y–z* plane. A graded energy gap material may be present in one or both sides of the junction, but it must be present in the material into which minority carriers responsible for radiation emission are injected. For example, let this be the p-side. Further, let the graded gap in this p-side increase lineraly along *y* from $y=0$ to $y=L$. This would occur, for example, in a $GaAs_xP_{1-x}$ alloy which becomes increasingly rich in P going from $y=0$ to $y=L$ in FIG. 7. A variable forward bias is applied across the heterojunction. This is shown in FIG. 7 as a variable voltage source 8 and in FIG. 8 as $V_{applied}$ which equals $F_n - F_p$, the difference in quasi Fermi levels of the n and p sides. Light emission first occurs near the $y=0$ end where, as shown in FIG. 8, the quasi Fermi level labeled $F_n$ of the n side of the junction becomes equal in energy to the lowest energy (labeled $E_{cp}$ in FIG. 8 in the p-side conduction band) capable of direct optical transition to empty states in the valence band or empty states nearby. In this example the lowest suitable point in the p-side conduction band occurs at Γ. Therefore, $E_{cp} = E_{cp}(\Gamma)$. Let the gap in the p-side be $g_1$ at this point along the y direction in the heterojunction shown in FIG. 7. Light will be emitted at frequency $v_1 = g_1/h$ from this point as shown. An increase in forward bias will allow points further along the heterojunction toward $Y=L$ to begin emission and at frequencies corresponding to the gap at those points in the material receiving the minority carrier injection. Thus, in FIG. 8 when $V_{applied} = g_i + E_{VP} - F_p$, light will be emitted in the $\pm$ z direction all along the heterojunction up to the point where the gap is $g_i$ and at frequencies lying between $g_1/h$ to $g_i/h$. Further increase in forward bias will eventually spread the light emitting region across the entire heterojunction extending the frequency to $g_m/h$ where $g_m$ is the maximum gap in the material receiving the minority carrier injection. Note that at each applied bias light will be emitted in the $\pm y$ direction. Hence, the light emitted along the $\pm y$ axis contains all the frequencies emitted along the junction plane and is consequently a white light source for sufficiently high applied forward bias.

A light emitting heterojunction can also be used as an optical diode, i.e., a device which will pass light incident from one direction but not pass light incident from another direction. The light passed can be controlled by a variable applied bias so that the light passed may be at a different intensity and frequency than that of the incident light.

Figure 9B:
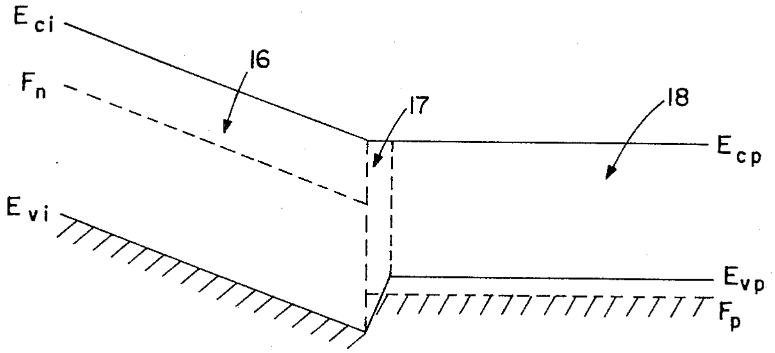
FIG. 9B is an energy vs. position representation for the device of FIG. 9.
Figures 9A, 10, 11:
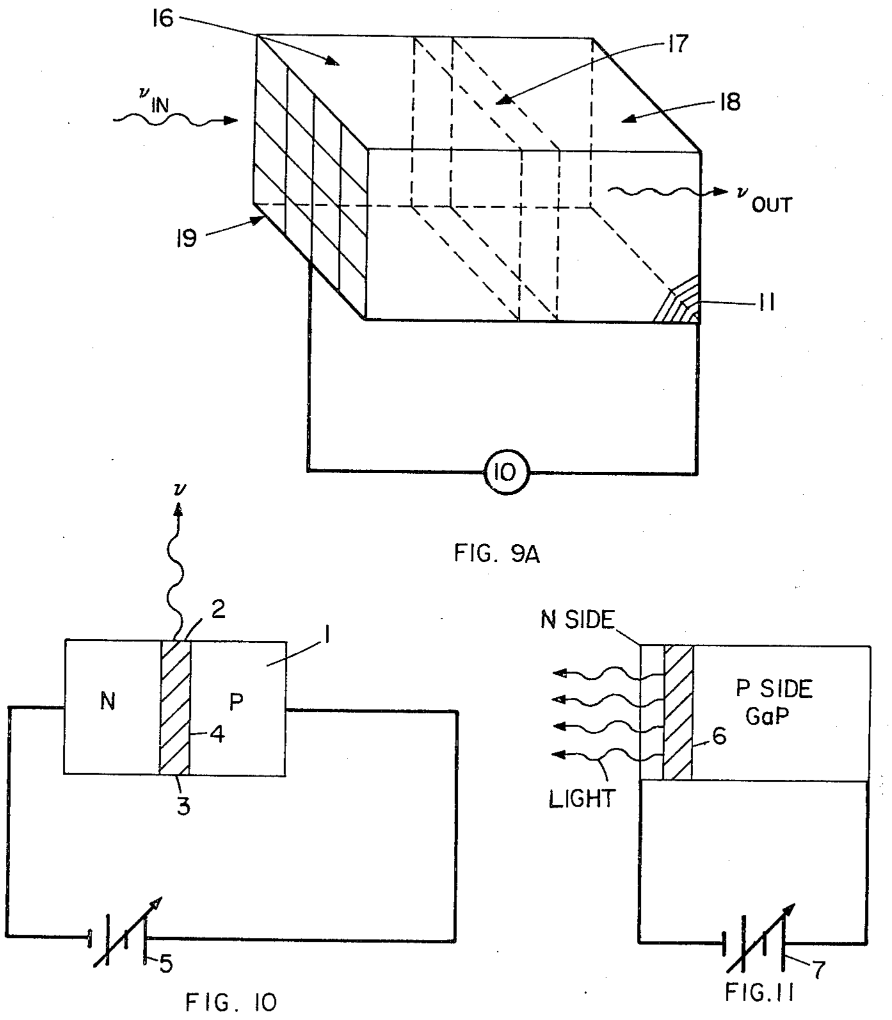
FIG. 9A is a schematic representation of a heterojunction optical diode with frequency conversion.
FIG. 10 is a schematic representation showing a p-n heterojunction device having means for forward biasing the device.
FIG. 11 is a schematic representation of a modification of the device of FIG. 10.

Such a device is shown in FIGS. 9A and 9B. In FIG. 9A the side of the junction shown at 16 can be either an intrinsic semiconductor or an insulator, the heterojunction is labeled 17, and the side numbered 18 can be p or n material. FIG. 9B shows the side 18 as p-type material. In FIG. 9A biasing of the semiconductor is accomplished by a variable voltage source 10. The semi-transparent electrode for applying an electric field across the intrinsic region is shown at 19 and the ohmic contact to the *n* or *p* region is shown at 11. The radiation incident on the intrinsic region passes through the semi-transparent electrode. Incident radiation will pass through the device with no control on it if its frequency is less than the smallest energy gap of the device. If the incident frequency is less than the corresponding energy gap of the intrinsic region but greater than the energy required to effect a direct optical transition on the *n* or *p* side, the incident light will be attenuated with no control in either direction. However, if the incident light has sufficient energy to excite a hole-electron pair across the energy gap in the intrinsic region, the device will operate as an optical rectifier. Such incident light striking the intrinsic side of the junction will produce carriers that can be accelerated to the junction shown at 17 by the voltage source 10. If the voltage is sufficiently high, the minority carrier will propagate into the semiconductor at a level where it can recombine emitting radiation which emerges from the device shown as $\nu_{out}$. The frequency $\nu_{out}$ is a recombination frequency in the *n* or *p* side and not in general equal to $\nu_{in}$. No radiation will be emitted if the voltage is not sufficiently high. Light striking the device on the *n* or *p* side of the junction with frequency corresponding to the gap of the intrinsic region shown at 16 will be absorbed in the *n* or *p* region shown at 18 and will not pass through the device.

Referring now to FIG. 10, a semiconductor crystalline device is shown at 1 and includes a p-n heterojunction. The plane of the junction, as previously discussed herein, is particularly oriented to provide minority injection thereacross that will effect direct optical transition. The p-type material may be an alloy of $GaAs_xP_{l-x}$ and the n-type material may be either AlP or ZnS or ZnSe or an alloy of $ZnS_ySe_{1-y}$ or $AlAs_yP_{1-y}$, where *x* and *y* assume values in the range of 0 to 1.

The device shown in FIG. 10 has an optical cavity defined by optically flat reflective surfaces 2 and 3 and including the junction region designated 4. The medium in the junction region is adapted to receive pumping energy from a variable voltage supply 5 to produce in the active part thereof an inverted population of energy states so that electromagnetic radiation therein is amplified by the process of stimulated emission. At least one of the reflective surfaces 2 and 3 is partially transparent to allow radiation to be emitted from the cavity, as shown. A more detailed discussion of dewar apparatus and solid-state lasers is contained in application Ser. No. 576,094 filed by the present inventor and another on Aug. 30, 1966 (now U.S. Pat. 3,530,400, granted Sept. 22, 1970).

The device in FIG. 11 is shown emitting light through the n side of a junction 6. A source of electric potential 7 is connected across the junction 6 in a manner to forward bias the junction to raise the energy band structure of the n-type material relative to that of the p-type material, as before explained.

A method of growth that has been found to be best for fabrication of a device employing GaP and ZnS is described in the next paragraph. The method employs liquid phase epitaxial growth of GaP onto ZnS, the ZnS plane being the (111) plane in one instance and the (308) plane in another. The (111) plane device according to the theory discussed above should not be a favorable one, and that proved to be so; the (308) plane, on the other hand, according to the theory, should be a favorable plane, and, again, that proved to be so.

The first step in the process used in that of polishing and etching the ZnS substrate which is then placed in a boat. A slug of Zn and granules of polycrystalline GaP (0.5 weight % of GaP) is placed in a well in the boat above the substrate. The boat is placed in a cool furnace which is purged for one hour with ultrahigh purity hydrogen; the hydrogen flow is then decreased, but a small flow is continued during the run. The furnace temperature is taken up to 750°C for 20 to 30 minutes and then lowered at the rate of 1° to 1.5°C/minute to 500°C. At 500°C the Zn/GaP well is slid from over the substrate and replaced by a well filled with Ga. The system is then cooled to room temperature before withdrawing the boat from the furnace.

Further modifications will occur to persons skilled in the art.

What is claimed is:

1. A semiconductor device adapted to emit electromagnetic radiation in at least one of the infrared, visible or ultraviolet region of the spectrum, that comprises, a diode structure that includes a p-n heterojunction between single crystal materials, the material on the n-side being doped to provide deep-lying impurity states in the gap and further doped to provide electrons in the conduction band, the heterojunction being disposed along a particularly oriented plane such that the law of conservation of components of momentum perpendicular to the normal to the heterojunction plane inhibits electron injection from the n-side to the p-side and enhances hole injection from the p-side into the deep-lying impurity states on the n-side to allow transitions of electrons from the conduction band of the n-side into the deep-lying impurity states and the consequent emission of radiation.

2. A device as claimed in claim 1 in which the material on the n-side is ZnS and the material on the p-side in GaP, the heterojunction lying in the 110 plane of GaP and a compatible plane of ZnS, and which includes means for applying a forward bias across the heterojunction, said means including ohmic contacts and a voltage source connected between said contacts.

3. A semi-conductor device as claimed in claim 1 having an optical cavity defined by optically flat reflective surfaces and including the junction region, the medium in said junction region being adapted to receive pumping energy to produce in the active part thereof an inverted population of energy states so that the electromagnetic radiation therein is amplified by the process of stimulated emission, at least one of said reflective surfaces being partially transparent to allow radiation to be emitted from said cavity.

4. A semiconductor device as claimed in claim 1 in which the p-type material is an alloy as $GaAs_xP_{l-x}$ and the n-type material is either AlP or ZnS or ZnSe or an alloy of $ZnS_ySe_{1-y}$ or $AlAs_yP_{1-y}$, where *x* and *y* range from 0 to 1 in each instance.

5. A semiconductor device as claimed in claim 4 in which the plane of the heterojunction is the 110 plane of the $GaAs_xP_{1-x}$ crystal and the 110 plane of either the $ZnS_ySe_{1-y}$ crystal or the $AlAs_yP_{1-y}$ crystal.

6. A semiconductor device as claimed in claim 4 in which the plane of the heterojunction is the 111 plane of the $GaAs_xP_{1-x}$ crystal and the 111 plane of either the $ZnS_ySe_{1-y}$ crystal or the $AlAs_yP_{1-y}$ crystal.

7. A semiconductor device as claimed in claim 4 in which the n-type material is epitaxially grown upon the p-type material or the p-type material is epitaxially grown upon the n-type material.

8. Apparatus as claimed in claim 4 having an optical cavity defined by optically flat reflective surfaces and including the junction region, the medium in said junction region being adapted to receive pumping energy to produce in the active part thereof an inverted population of energy states so that electromagnetic radiation therein is amplified by the process of stimulated emission, at least one of said reflective surfaces being partially transparent to allow radiation to be emitted from said cavity.

9. A semiconductor device as claimed in claim 8 having a source of electric bias potential connected across the junction region such that the semiconductor is forward biased thereby to provide energy for pumping said junction region.

10. A luminescent semiconductor crystalline device that comprises: a structure including a planar heterojunction, at least one of the materials of which the heterojunction consists having the property that control over minority injection across the heterojunction can be effected and containing states from which or to which direct optical transitions can take place, the plane of the heterojunction being one having the property that useful control over minority carrier injection across the heterojunction can be effected by the requirements of momentum conservation and that those minority carriers that are preferantially injected go into states from which or to which direct optical transitions can take place, one side of the junction being either an intrinsic semiconductor or an insulator and the other side being either *n* or *p* type extrinsic material, the device being adapted to receive incident radiation propagating in a direction substantially normal to the heterojunction plane, to transmit the radiation in one direction only and to vary the intensity and frequency of the radiation passed therethrough, the intrinsic material having a wider forbidden gap than the extrinsic material.

11. A device as claimed in claim 10 having voltage bias means connected across the entire device to provide either an accelerating or a retarding force on the minority carriers to be injected into the *n* or the *p* side of the junction.

* * * * *